(12) United States Patent
Huang et al.

(10) Patent No.: US 6,897,543 B1
(45) Date of Patent: May 24, 2005

(54) ELECTRICALLY-PROGRAMMABLE INTEGRATED CIRCUIT ANTIFUSES

(75) Inventors: Cheng H. Huang, Cupertino, CA (US);
Yowjuang Liu, San Jose, CA (US);
Chih-Ching Shih, Pleasanton, CA (US); Hugh Sung-Ki O, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/646,013

(22) Filed: Aug. 22, 2003

(51) Int. Cl.[7] ............................................. H01L 29/00
(52) U.S. Cl. ....................... 257/530; 257/529; 257/603; 257/106; 257/175; 438/131; 438/467; 438/600; 438/983
(58) Field of Search .................. 257/530, 529, 257/603, 106, 175; 438/131, 467, 600, 983

(56) References Cited

U.S. PATENT DOCUMENTS

| | | | |
|---|---|---|---|
| 4,207,556 A | | 6/1980 | Yoshi et al. |
| 4,433,331 A | | 2/1984 | Kollaritsch |
| 4,609,986 A | | 9/1986 | Hartmann et al. |
| 4,617,479 A | | 10/1986 | Hartmann et al. |
| 4,642,487 A | | 2/1987 | Carter |
| 4,761,768 A | | 8/1988 | Turner et al. |
| 5,070,384 A | | 12/1991 | McCollum et al. |
| 5,291,434 A | * | 3/1994 | Kowalski ............... 365/185.04 |
| 5,303,199 A | | 4/1994 | Ishihara et al. |
| 5,463,244 A | | 10/1995 | De Araujo et al. |
| 5,510,730 A | | 4/1996 | El Gamal et al. |
| 5,774,011 A | * | 6/1998 | Au et al. ...................... 327/525 |
| 5,831,923 A | | 11/1998 | Casper |
| 5,844,298 A | | 12/1998 | Smith et al. |
| 6,108,261 A | | 8/2000 | Kim et al. |
| 6,125,069 A | | 9/2000 | Aoki |
| 6,240,033 B1 | * | 5/2001 | Yang et al. ............... 365/225.7 |
| 6,456,546 B2 | | 9/2002 | Kim et al. |
| 6,477,094 B2 | * | 11/2002 | Kim et al. ................... 365/200 |
| 6,674,667 B2 | * | 1/2004 | Forbes .................. 365/185.24 |
| 2004/0100849 A1 | * | 5/2004 | Novosel et al. .......... 365/225.7 |

OTHER PUBLICATIONS

U.S. Appl. No. 10/780,427, Chih–Ching Shih et al.
Wei Zhange et al., "Energy Effect of the Laser–Induced Vertical Metallic Link", IEEE Transactions on Semiconductor Manufacturing, vol. 14, No. 2, May 2001 pp 163–169.
"Analyzing the process window for laser copper–link processing" Solid State Technology—Semiconductor manufactoring and water fabrication, Jan. 8, 2003.

(Continued)

*Primary Examiner*—Nathan J. Flynn
*Assistant Examiner*—Remmon R. Fordé
(74) *Attorney, Agent, or Firm*—G. Victor Treyz

(57) ABSTRACT

Integrated circuit antifuse circuitry is provided. A metal-oxide-semiconductor (MOS) antifuse transistor serves as an electrically-programmable antifuse. In its unprogrammed state, the antifuse transistor is off and has a relatively high resistance. During programming, the antifuse transistor is turned on which melts the underlying silicon and causes a permanent reduction in the transistor's resistance. A sensing circuit monitors the resistance of the antifuse transistor and supplies a high or low output signal accordingly. The antifuse transistor may be turned on during programming by raising the voltage at its substrate relative to its source. The substrate may be connected to ground through a resistor. The substrate may be biased by causing current to flow through the resistor. Current may be made to flow through the resistor by inducing avalanche breakdown of the drain-substrate junction or by producing Zener breakdown of external Zener diode circuitry connected to the resistor.

18 Claims, 11 Drawing Sheets

OTHER PUBLICATIONS

Alexander Kalnitsky et al. "CoSi2 integrated fuses on poly silicon for low voltage 0.18 um CMOS applications" (c) 1999 IEEE.

Mohsen Alavi "A PROM Element Based on Salicide Agglomeration of Poly Fuses in a CMOS logic process" IEEE International Electron Devices Meeting, Dec. 1997.

Noriaki Sato et al. "A New Programmable Cell Utilizing Insulator Breakdown", IEDM 1985, pp 639–642.

Jinbong Kim et al. "Three–Transistor One–Time Programmable (OTP) ROM Cell Array Using Standard CMOS Gate Oxide Antifuse", IEEE Electron Device Letters, vol. 24, No. 9, Sep. 2003 pp. 589–591.

Wei Zhang et al. "Laser–Formed Vertical Metallic Link and Potential Implementation in Digital Logic Integration", PROC MAPLD, MD, 1999 pp 1–7 (B5).

V. Klee et al. "A 0.13 um logic–based embedded DRAM technology with electrical fuses, Cu interconnect in SiLK, sub–7ns random access time and its extension to the 0.10 um generation," IEEE (c) 2001 IEDM (International Electron Devices Meeting), Technical Digest, pp 18.5.1–18.5.4.

Wei Zhang et al., "Reliability of laser–induced metallic vertical links," IEEE Trans. on Advanced Packaging, pp 614–19 Nov. 1999 vol. 22 Issue 4.

JB Bernstein et al. "Analysis of laser metal–cut energy process window" IEEE Trans. on Semicond. Manuf., pp 228–234, May 2000, vol. 13, Issue 2.

JB Bernstein et al. "Laser energy limitation for buried metal cuts" IEEE Electron Device Letters, pp 4–6, Jan. 1998, vol. 19, Issue 1.

RT Smith et al. "Laser programmable redundancy and yield improvement in a 64 K DRAM", IEEE Journal of Solid–State Circuits, pp 506–514 Oct. 1981, vol. 16, Issue 5.

* cited by examiner

ELECTRICALLY-PROGRAMMABLE INTEGRATED CIRCUIT ANTIFUSES

BACKGROUND OF THE INVENTION

This invention relates to antifuses, and more particularly, to electrically-programmable integrated circuit antifuses.

Programmable fuses and antifuses are used in a variety of integrated circuit applications. For example, a programmable logic device may have logic that is customized by programming appropriate fuses or antifuses on the device. Fuses and antifuses may also be used to permanently switch redundant circuitry into place to fix reparable defects during the integrated circuit manufacturing process. Sometimes it may be desired to use fuses or antifuses to program a serial number or other special information into a circuit (coding).

Fuses and antifuses may be programmed using special laser-based systems or may programmed electrically.

Laser-programmable fuses are often used for integrated circuits that have aluminum interconnects. Polysilicon and aluminum fuses can be blown open by focusing a precisely-aligned laser beam on the appropriate fuses. Because each fuse must be serially-programmed, the programming process can be lengthy. The programming equipment used in laser-based systems may also be complex and expensive.

There are additional concerns when using laser-based fuses with the increasingly-popular copper interconnects. Because copper has a high reflectivity and low coefficient of thermal expansion, it is generally more difficult to use a laser to blow open a copper fuse than an aluminum fuse. There is a range of acceptable laser energies that can be used to properly blow a copper fuse. The laser energy must be sufficient to complete the laser cut through the copper. At the same time, the laser energy cannot be too high to avoid cracking.

Laser-based antifuses have also been proposed. With this type of arrangement, a vertical conducting link between two adjoining metal layers may be formed by application of the laser beam. As with laser-based fuses, laser antifuses only work within a certain range of laser energies. Laser-based antifuse programming equipment can also be complex and expensive.

Electrically programmable fuses are attractive because the need for laser-based programming equipment is eliminated and programming speeds can generally be increased.

Non-volatile memory fuses such as fuses based on electrically-programmable read-only memory (EPROM) technology or electrically-erasable programmable read-only memory (EEPROM) technology have been used. These fuses generally require high voltages to store charges in their floating gate memory cells. The high voltages may be supplied using external equipment or using integrated charge pump circuitry. While it is possible to scale down the programming voltages of these floating-gate cells by thinning the tunnel dielectric, the tunnel dielectric cannot be too thin or the data retention time of the cell will suffer. Moreover, it can be difficult to integrate non-volatile memory-based fuses into many logic circuit designs, because the special fabrication steps needed to produce the non-volatile memory-based fuses may add otherwise unnecessary constraints to the logic fabrication process.

Another type of electrically-programmable fuse that has been investigated uses silicided polysilicon devices. When high current is applied to these fuses, the resulting agglomeration of salicide on top of the polysilicon resistor increases its resistance. The programming of this type of fuse typically requires application of a programming current of 20 milliamps for a duration of 100 ms. The sensing circuits used with such fuses also tend to dissipate a large amount of power when the fuses are in their unprogrammed states. The programming process also may not be entirely permanent, because over time cobalt may migrate into the boundaries between silicide grains, thereby reducing resistance.

Electrically-programmed antifuses have been proposed that are programmed using insulator breakdown. A thin insulator is provided between two adjacent metal layers. When a sufficient voltage is applied to the metal layers, the insulator breaks down, thereby shorting the metal layers together. Although these antifuses can generally be programmed using lower powers than those used to program silicided polysilicon devices, the antifuses can be difficult to fabricate. In particular, deposition and etch-back steps needed to provide a thin oxide for the antifuses under the normally clear contact regions on the device may add undesirable complexity to the fabrication process.

Electrically-programmed antifuses based on floating-gate structures with two shortable polysilicon layers have also been proposed. With this arrangement, an oxide between the lower of the two polysilicon layers and a substrate can be broken down using a high voltage programming signal. These antifuses require 20 volts for programming. Moreover, because two polysilicon layers are required, these antifuses cannot be used on circuits that are fabricated using a single-layer polysilicon process.

It is therefore an object of the present invention to provide improved integrated circuit fuses or antifuses.

SUMMARY OF THE INVENTION

Integrated circuit antifuse circuitry is provided. Antifuses may be based on metal-oxide-semiconductor (MOS) transistors formed on the semiconductor substrate of an integrated circuit. Programming and sensing circuitry may be connected to the antifuse transistor. The programming circuitry may be used to apply appropriate programming signals to the antifuse transistor during programming. The sensing circuitry may be used to convert the resistance value of the antifuse transistor into a corresponding output voltage signal for other circuitry on the integrated circuit.

When an antifuse transistor is in its unprogrammed state, the transistor is off and its drain-to-source resistance is high. During programming, sufficient current flows through the transistor to induce localized melting in the semiconductor substrate in the vicinity of the transistor. The melted semiconductor reduces the drain-to-source resistance of a programmed antifuse transistor by a factor of about four orders of magnitude relative to an unprogrammed antifuse transistor.

The antifuse transistor has source, drain, gate, and substrate terminals. To turn on the transistor on with sufficient strength to produce melting of the semiconductor, the substrate voltage is taken about 0.7 to 1.0 volts higher than the source region voltage. This forward biases the substrate-source junction and injects carriers into the transistor in the substrate region under the gate. The carrier injection in this region turns the transistor on and produces a high current between the drain and source terminals.

The substrate voltage may be raised using any suitable arrangement. One way in which to raise the substrate voltage is using an external resistor connected between the substrate and a source of ground potential. By causing current to flow through the resistor, the substrate voltage can be raised during programming.

Current can be made to flow through the resistor using any suitable circuitry. With one suitable arrangement, a programming voltage is applied to the drain of the antifuse transistor. This causes avalanche breakdown in the drain-substrate p-n junction. The resulting avalanche current flows through the resistor and raises the substrate voltage. As the substrate voltage rises, the substrate-source junction becomes forward biased, which injects more carriers into the depletion region at the drain-substrate junction and serves as a source of positive feedback. When the carrier injection into the substrate region is sufficient, the drain-source current rises high enough to melt the semiconductor between the drain and source, thereby creating a conductive pathway that permanently reduces the antifuse transistor's resistance.

With another suitable arrangement, a number of Zener diodes (e.g., two Zener diodes) are connected between the drain and substrate. When the programming voltage is applied to the Zener diodes, it induces Zener breakdown. The current flowing through the Zener diodes during Zener breakdown flows through the resistor and bias the substrate sufficiently to turn on the antifuse transistor and melt the semiconductor. The Zener breakdown voltage of the Zener diodes may be low enough to allow programming with readily available power supply voltages such as the standard I/O power supply voltage used to operate peripheral circuitry surrounding lower-level core logic.

The substrate region lying beneath the antifuse transistor may be electrically isolated from the remaining substrate using a deep n-well isolation region.

Further features of the invention, its nature and various advantages will be more apparent from the accompanying drawings and the following detailed description of the preferred embodiments.

DETAILED DESCRIPTION OF THE PREFERRED EMBODIMENTS

Programmable fuses and antifuses may be used to program (configure) portions of an integrated circuit. The integrated circuit may be, for example, a programmable logic device that has user-customizable logic. The integrated circuit may also be a microprocessor, a digital signal processor, an application specific integrated circuit, logic, memory, a digital circuit, an analog circuit with programmable devices, a combination of such circuits or any other suitable integrated circuit.

The integrated circuit may be programmed by a manufacturer or by an intermediate or end user. For example, if a manufacturer desires to include a serial number or special coding in the integrated circuit, the manufacturer can program the fuses or antifuses on the integrated circuit appropriately during the manufacturing process. As another example, a manufacturer may produce integrated circuits that contain redundant circuitry. If a repairable defect is detected by the manufacturer during device testing, an appropriate spare circuit may be switched into use to replace the defective circuit.

Programmable logic devices can be customized by users to perform desired logic functions. Such devices may be customized by programming fuses and/or antifuses appropriately. Programmable logic devices may also use fuses and antifuses to implement redundancy schemes or to store codes, serial numbers, or other special information in a non-volatile manner as with other integrated circuits.

Electric programming of fuses and antifuses is often preferable to laser-based programming, because costly and complex laser-based programming systems are not needed. Fuses conduct current when unprogrammed and become open circuits when placed in a programmed state. Antifuses are open circuited when unprogrammed and become conducting when programmed.

The present invention relates to improved antifuses.

Figure 1:
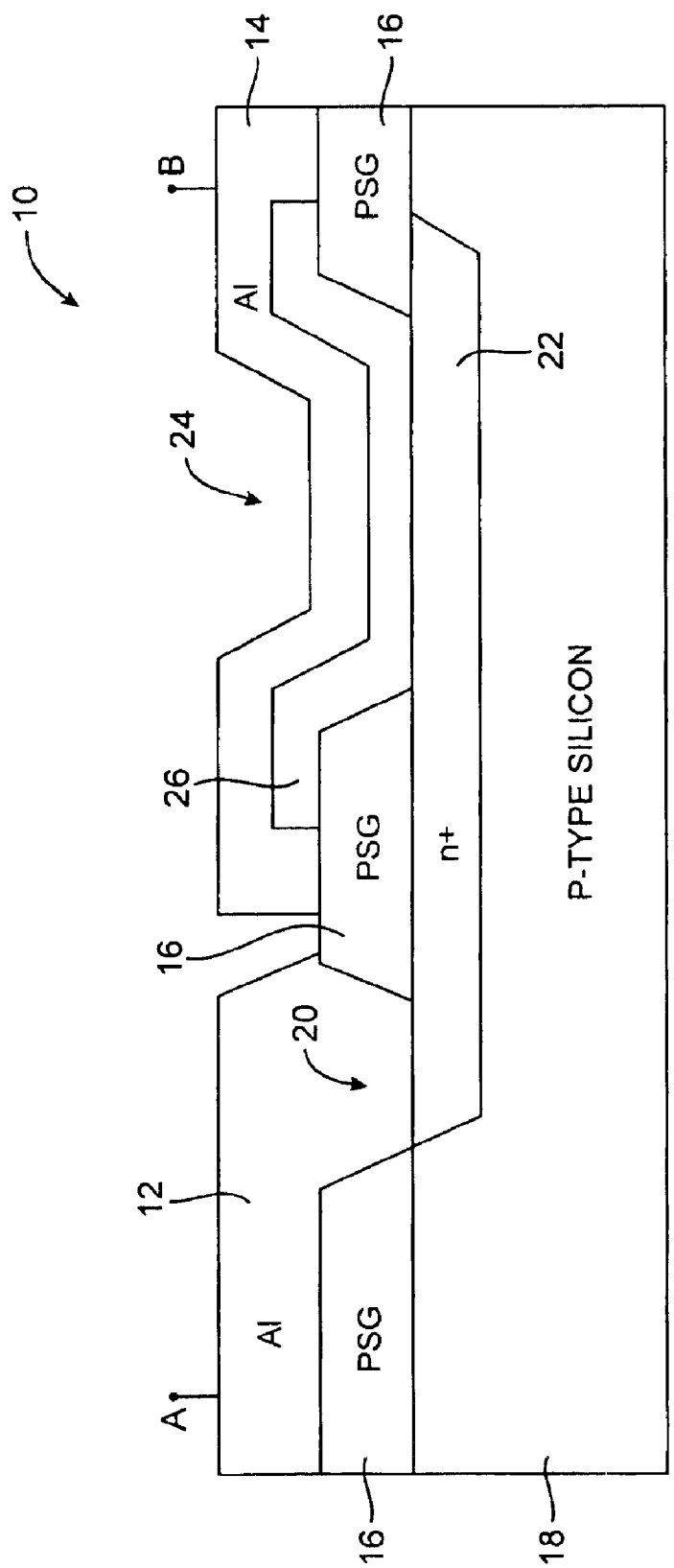
FIG. 1 is a cross-sectional view of a conventional antifuse of the insulator-breakdown type.

A conventional antifuse 10 that uses an oxide-breakdown arrangement is shown in FIG. 1. Aluminum metal contacts 12 and 14 form the two terminals A and B of the antifuse. A thick patterned layer of phosphosilicate glass (PSG) 16 is used to insulate a p-type silicon substrate 18 from the aluminum layer except at contact 20. At contact 20, the aluminum 12 forms an ohmic contact with buried n+ silicon region 22. The portion of region 22 that lies beneath contact region 24 forms an extension of the A terminal.

A thin layer of insulator 26 is formed between the aluminum 14 of the B terminal and the conducting n+ silicon portion 22 of the A terminal. When the antifuse is unprogrammed, the insulator prevents current from flowing between the A and B terminals.

When it is desired to program the antifuse of FIG. 1, a high voltage of about 20 volts is applied to terminals A and B. The high voltage programs the antifuse 10 by breaking down the insulator 26. In its programmed state, antifuse 10 conducts electricity between terminals A and B.

Figure 10:
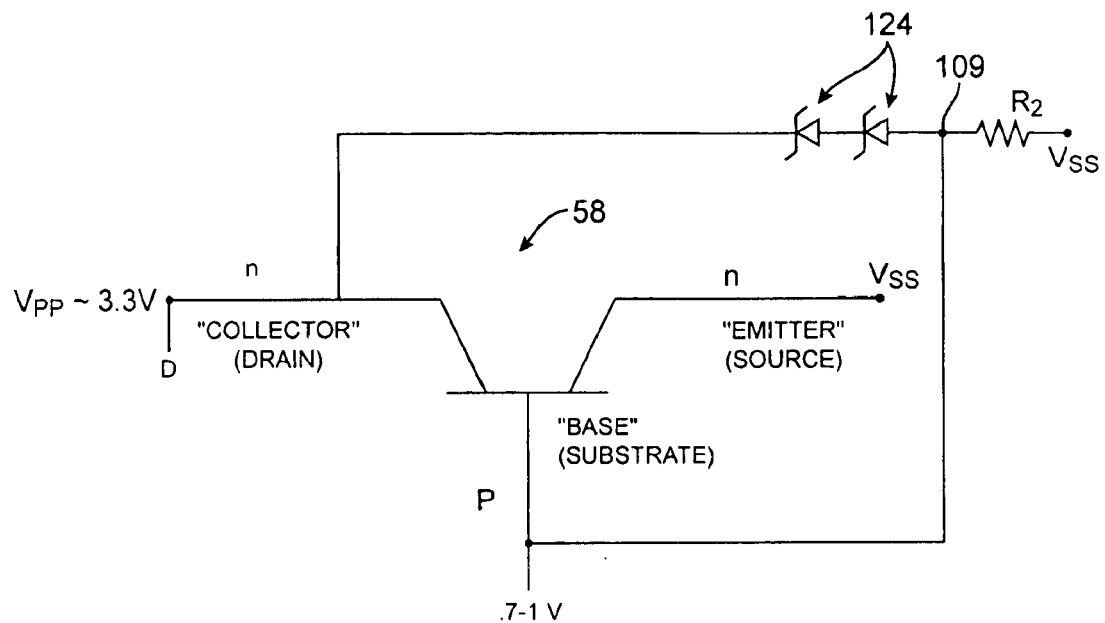
FIG. 10 is a circuit schematic showing how the parasitic bipolar transistor characteristics of the antifuse transistor cause the transistor to conduct current during programming in accordance with the present invention.

The conventional antifuse 10 of FIG. 1 requires a fairly large programming voltage of about 20 volts. It may also be impossible to form the antifuse structure of FIG. 1 using conventional semiconductor fabrication processes unless undesirable additional process steps are used. There is also a risk of damaging the dielectric interconnect stack on the integrated circuit when the antifuse of FIG. 10 is programmed.

Figure 2:
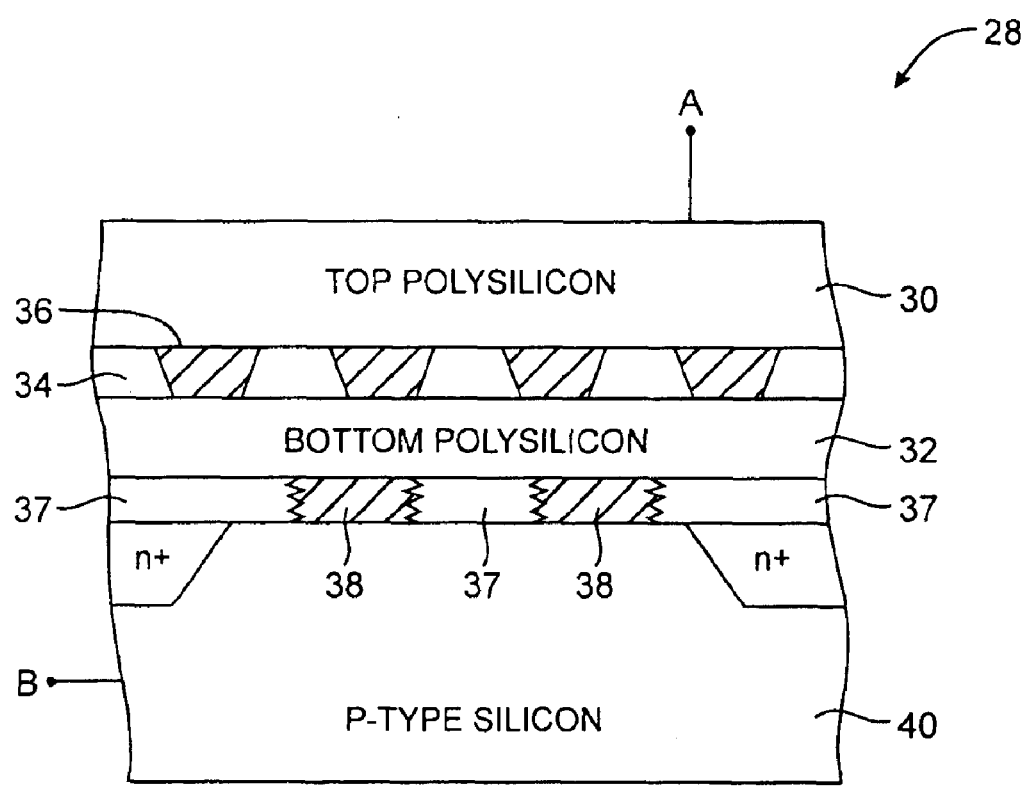
FIG. 2 is cross-sectional view of a conventional oxide-breakdown antifuse based on a two-poly-layer non-volatile memory cell arrangement.

Another conventional antifuse arrangement is shown in FIG. 2. With the arrangement of FIG. 2, antifuse 28 has two polysilicon layers: top polysilicon layer 30 and bottom polysilicon layer 32. A layer of insulator 34 with a number of conductive via holes 36 lies between layers 30 and 32. Metal in the via holes 36 electrically connects the top and bottom polysilicon layers 30 and 32.

In its unprogrammed state, the bottom polysilicon layer 32 of antifuse 28 is electrically isolated from p-type silicon substrate by insulating layer 37. When programming, the programming voltage for the floating gate serves to break down the insulator 37 to form conductive paths 38. The conductive paths 38 electrically connect terminals A and B.

The conventional antifuse structure of FIG. 2 requires a high programming voltage. The structure of FIG. 2 also uses two layers of polysilicon. Depending on the fabrication process being used to form the integrated circuit, it may not be possible or acceptable to fabricate structures that require two layers of polysilicon.

Figure 3:
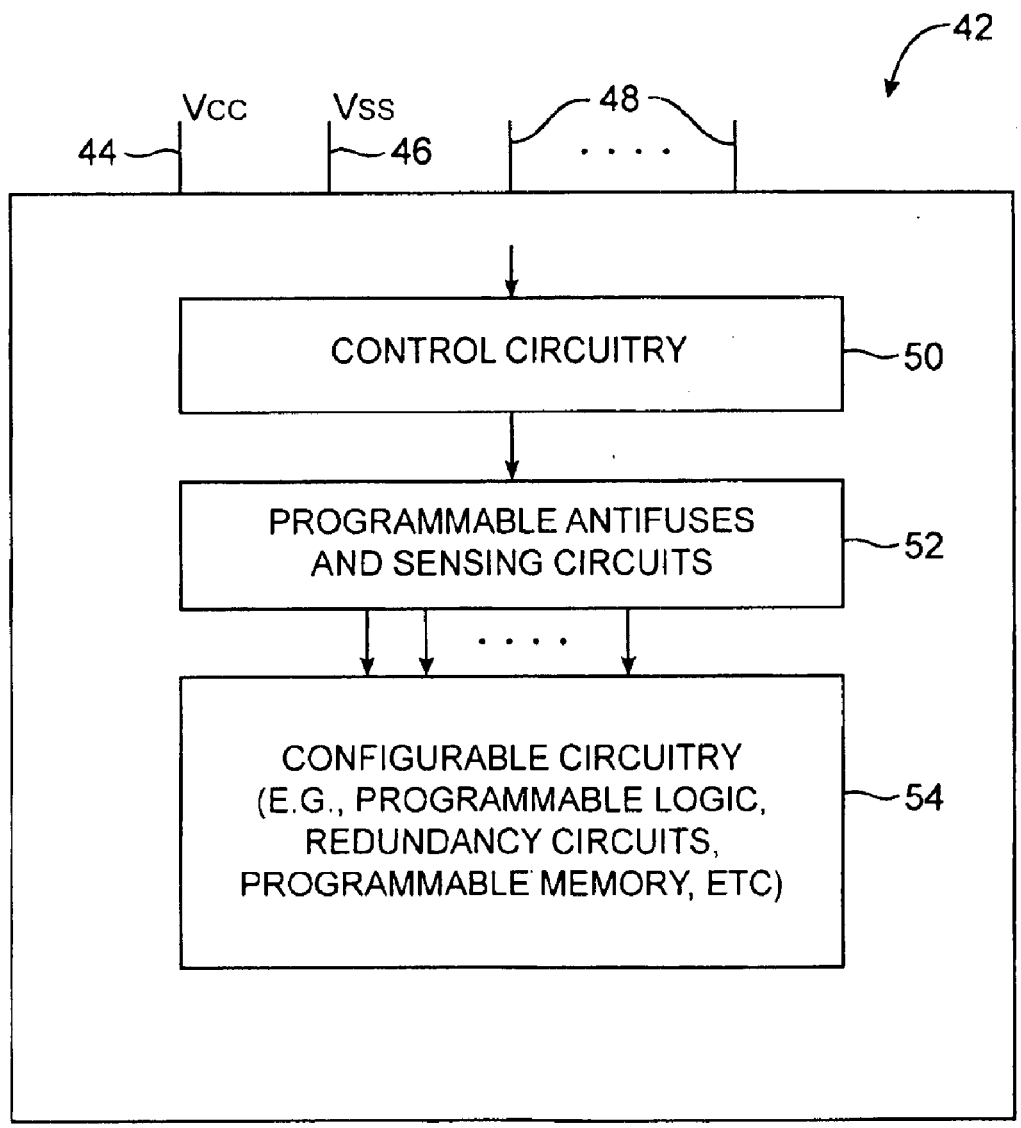
FIG. 3 is a schematic diagram of an illustrative integrated circuit having electrically-programmable antifuses and circuitry for electrically-programming the antifuses in accordance with the present invention.

An integrated circuit 42 in accordance with the present invention is shown in FIG. 3. The integrated circuit 42 may have one or more power supply terminals such as terminal 44 and terminal 46. Terminals such as terminal 44 may be used to supply a positive power supply voltage (e.g., a Vcc voltage of 1.2 volts). Terminals such as terminal 46 may be used to supply a ground potential (e.g., a Vss voltage of 0 volts). Terminals 48 may be used for I/O signals (e.g., normal data signals during device operation and programming signals during device programming operations). Terminals such as terminals 48 may be used to provide other power supply voltages (e.g., a programming voltage of about 5.5 V if desired).

The particular voltages described herein are merely illustrative. Any other suitable voltage levels may be used if desired. Moreover the polarities of the signals (positive and negative) and types of semiconductor (e.g., n-type and p-type silicon) that are used are merely illustrative.

Although described in the context of a silicon-based arrangement, integrated circuit 42 may be based on any suitable semiconductor. For example, the substrate material from which circuit 42 is formed may be a semiconductor such as silicon (or silicon-on-insulator), silicon germanium, gallium arsenide, indium phosphide, combinations of such materials, etc. These substrate materials are typically processed while in the form of wafers that are subsequently divided into individual circuits 42 prior to packaging.

The circuitry of integrated circuit 42 is interconnected by a number of layers of circuit interconnections. These interconnect layers include patterned conductors and insulators. The conductors of the regular metal interconnects on circuit 42 serve to route signals between various devices on circuit 42. The insulators serve to electrically isolate the conductors from each other and from the devices formed in the substrate. The layers of insulators and conductors in the interconnects and the antifuse structures, active devices, and associated circuitry of circuit 42 may be formed using plasma deposition and etching, chemical vapor deposition, sputtering and evaporation, electroplating, ion-implantation and diffusion, thermal oxide growth, and other suitable semiconductor fabrication techniques.

In a typical modern integrated circuit there are about 4–9 interconnect layers and other layers of material such as polysilicon, silicides, nitride, solder bumps, and passivation layers. For clarity, only the most relevant portions of the antifuses and associated structures are shown in the FIGS.

The programming signals and power supply signals from I/O terminals such as terminals 44, 46, and 48 may be provided to circuitry within the integrated circuit such as control circuitry 50. Control circuitry 50 may increase the voltage of the power supply (if desired) and may produce programming signals at appropriate voltage and current levels for antifuse programming. As an example, control circuitry 50 may increase the strength of low-level programming signals provided at I/O pins 48 so that the resulting strengthened signals may be used to program antifuses 52.

The programmable antifuses may have associated sensing circuitry 52. The sensing circuitry may be used to convert the resistance of an antifuse (which may be either high or low depending on the state of the antifuse) into a corresponding voltage signal (e.g., a high or low logic voltage level $V_{OUT}$). Each antifuse may have an associated sensing circuit. The output voltage $V_{OUT}$ from each antifuse sensing circuit may be applied to a corresponding controllable device (e.g., a transistor gate or gates, one or more transistor gates in a multiplexer, switch, pass transistor, or the input or control terminal of any other suitable logic element or circuit component on circuit 42). Such configurable components are depicted generally as configurable circuitry 54 in FIG. 3. The configurable components may be configurable programmable logic (e.g., on a programmable logic device), may be part of a memory (or a circuit that serves a memory function), may be part of a switch associated with a redundancy scheme, or any other suitable circuitry that it is desired to configure.

If desired, the outputs $V_{OUT}$ of the sensing circuits may be read without using them to specifically configure any downstream logic. For example, if it is desired to program a serial number or other code into the circuit 42, the appropriate bits may be programmed into circuit 42 by programming antifuses accordingly. The output signals from the sensing circuitry associated with the antifuses will then represent the states of the programmed antifuses. If access to the information programmed into the antifuses is desired, circuitry 54 may be used to access and read the states of the sensing circuit outputs.

Figure 4:
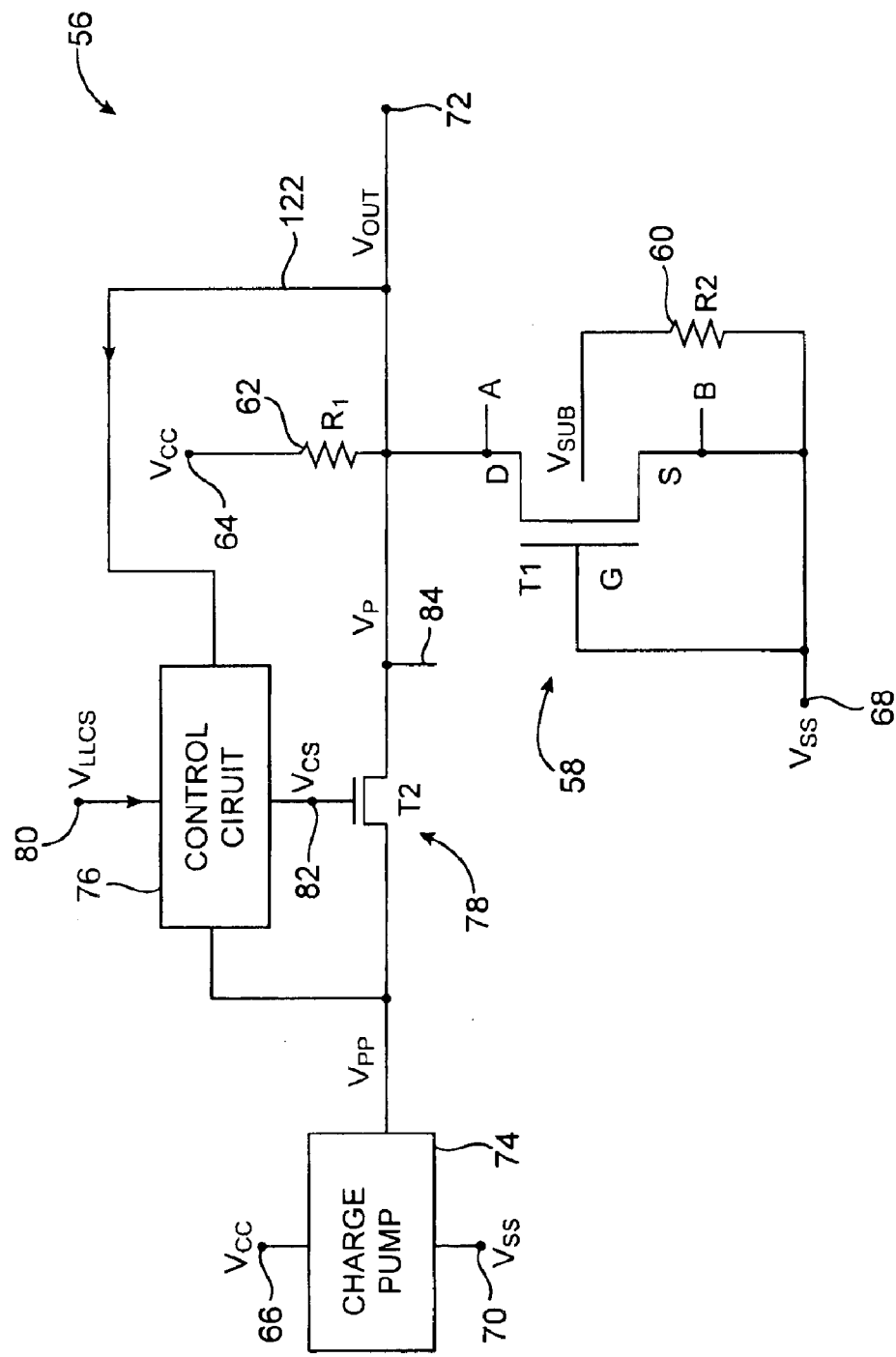
FIG. 4 is a top view of an illustrative electrically-programmable antifuse and associated programming and sensing circuitry in accordance with the present invention.

An illustrative antifuse circuit 56 for an integrated circuit such as integrated circuit 42 of FIG. 3 is shown in FIG. 4. In the illustrative arrangement of FIG. 4, transistor 58 (T1) serves as the antifuse. Transistor T1 is shown illustratively as an NMOS transistor, but a PMOS transistor may be used if desired, provided that appropriate changes are made to the connections to its gate, drain, source, and substrate terminals.

In circuit 56, resistors 60 and 62 (having respective illustrative resistances of about 5 MΩ and 10 MΩ) serve as part of a programming and sensing circuit. The sensing circuit serves to convert the programmed or unprogrammed resistance value of transistor 58 into a corresponding logic high or low signal $V_{OUT}$ at sensing circuit output terminal 72 during post-programming operation of circuit 42.

A power supply voltage (e.g., a voltage $V_{CC}$ of 1.2 volts) may be provided to terminals 64 and 66. A source of ground potential (e.g., a voltage Vss of 0 volts) may be applied to terminals 68 and 70.

A charge pump circuit 74 or other suitable circuitry may be used to generate a programming supply voltage (e.g., a voltage $V_{PP}$ of 5.5 volts) from voltages $V_{CC}$ and $V_{SS}$. The programming supply voltage may be greater than the normal power supply voltage $V_{CC}$ used on chip 42. The use of charge pump 74 to increase the voltage level of $V_{CC}$ to that of $V_{PP}$ avoids the need to provide $V_{PP}$ from an external source (e.g., one of pins 48 of FIG. 3), although such an external supply arrangement may be used if desired. The $V_{pp}$ voltage can be generated from any suitable voltage including an I/O voltage that is higher than Vcc.

The programming supply voltage $V_{PP}$ is used as an input to gating transistor (pass transistor) 78. The gate of transistor 78 may be controlled by appropriate control signals $V_{CS}$ supplied at terminal 82. With one suitable arrangement, low-level programming signals (e.g., logic-level programming information $V_{LLCS}$) may be provided at terminal 80 of control circuit 76. The logic-level programming information $V_{LLCS}$ may, for example, be provided from external electrical programming equipment that is connected to circuit 42 through one or more of pins 48 during the configuration or programming of circuit 42 at a manufacturer as part of the manufacturing process or during the programming of circuitry 42 by an intermediate user or end user.

The control circuit 76 may use the elevated programming power supply voltage $V_{PP}$ and the lower-level programming information signals $V_{LLCS}$ to create corresponding programming control signals $V_{CS}$. These control signals may be provided to the control gate of pass transistor 76. During programming, the output of pass transistor 78 (programming signal $V_P$) is provided to output terminal 84. A typical programming signal $V_P$ has a magnitude $V_{PP}$ of 5.5 volts minus the threshold-voltage of the pass-gate transistor T2 and a duration of about 20–50 ms. The $V_p$ signal can be kept the same while reducing the $V_{pp}$ voltage if a PMOS-pass gate transistor is used in place of the illustrative NMOS-pass gate transistor shown in FIG. 4. Such a PMOS pass gate transistor can be turned on with the application of ground voltage to its gate 82.

Only a single 20–50 ms programming pulse is generally required to program each antifuse bit, so programming all of the antifuses on circuit 42 is relatively rapid. Moreover, because the power required to program each antifuse is relatively low, multiple bits may be programmed in parallel by control circuitry 50 (FIG. 3).

When antifuse transistor 58 is unprogrammed (its initial state), the drain-to-source resistance of transistor 58 (the resistance between drain D at antifuse terminal A and source S at antifuse terminal B in FIG. 4) is high (e.g., 100 MΩ or more). With antifuse transistor 58 in an unprogrammed state, a negligible current therefore flows through transistor 58. This low current characteristic of the antifuse helps to lower the power dissipation through the unprogrammed antifuse circuitry on circuit 42. The high unprogrammed resistance of the transistor 58 relative to the resistance of resistor R1 causes the output voltage $V_{OUT}$ to rise almost to $V_{CC}$, thereby producing a logic high signal $V_{OUT}$ at terminal 72 of the sensing circuit.

When antifuse transistor 58 is programmed by momentarily applying voltage $V_{PP}$ across its drain and source terminals, the drain-to-source resistance of transistor 58 drops significantly (e.g., by about four or five orders of magnitude or more). The resulting low resistance of transistor 58 pulls the voltage on terminal 72 low, so that the output voltage $V_{OUT}$ is at a logic low signal level.

Figure 5:
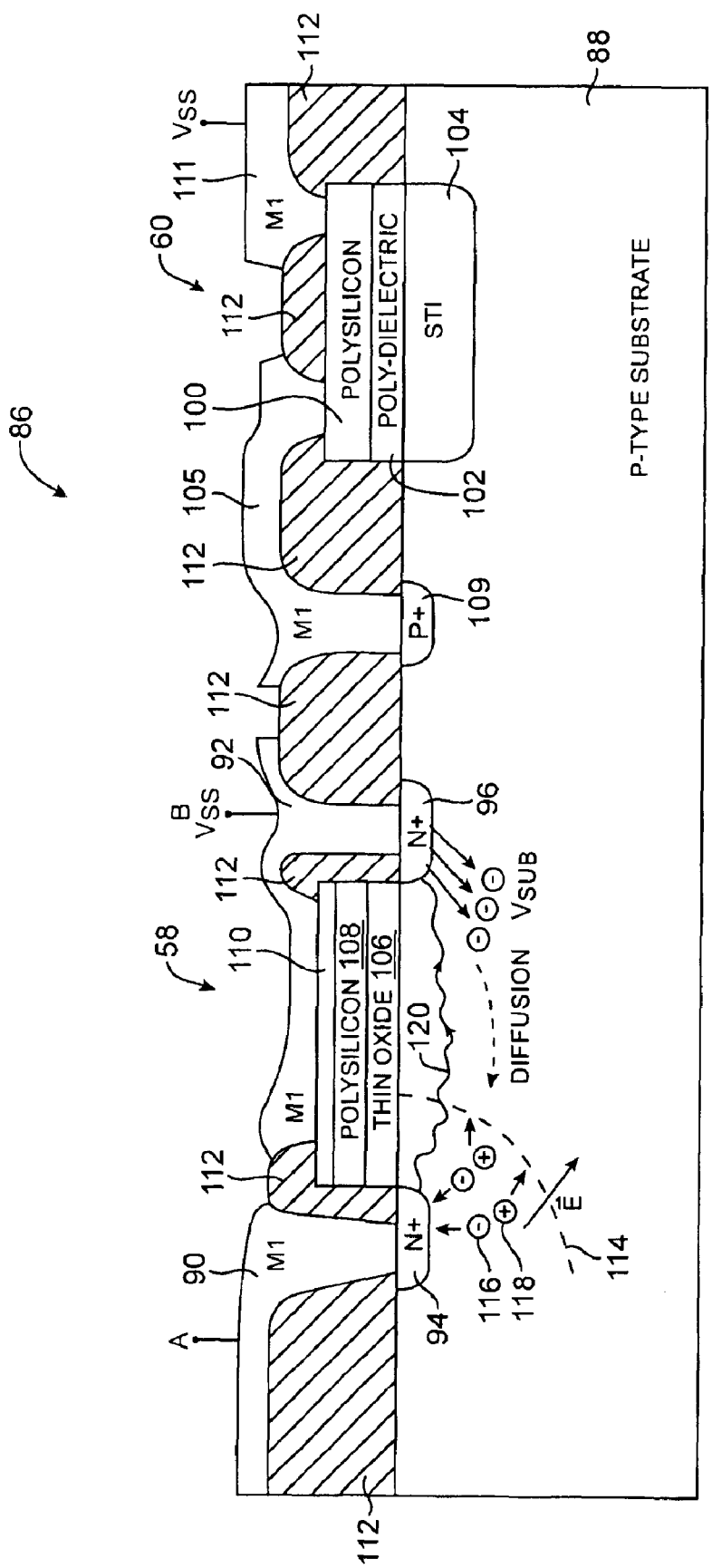
FIG. 5 is a cross-sectional side view of an illustrative antifuse and associated circuitry in accordance with the present invention.

An illustrative cross-section of a suitable device structure 86 suitable for implementing the antifuse circuitry of FIG. 4 is shown in FIG. 5. The antifuse transistor 58 has a drain contact metal 90 (labeled drain terminal D and antifuse terminal A in FIG. 4). The antifuse transistor 58 also has a source metal 92. Drain terminal 90 is connected to n+ region 94 to form the drain of n-type metal-oxide-semiconductor (NMOS) transistor 58. Source terminal 92 is connected to n+ region 96 to form the source of transistor 58.

Transistor 58 has a gate (labeled G in FIG. 4) that is formed from a thin (typically 10s or 100s of angstroms thick) oxide 106 (typically thermal oxide) covered by a polysilicon layer 108. A layer of silicide 110 (e.g., cobalt silicide) may be deposited on top of polysilicon 108 to assist in forming a good ohmic contact for the gate. A layer of silicide may also be deposited on top of the drain n+ region 94 and the source n+ region 96 to assist in localizing the programming current. This reduces the total programming current needed for programming the antifuse transistor.

The gate silicide materials are electrically connected to the overlying portion of metal 92 (i.e., the gate metal). Unlike the prior art arrangement of FIG. 2, with the arrangement of FIG. 5, only a single layer of polysilicon is needed for the gate. Because metal 92 lies between the gate region and the source region, metal 92 interconnects the gate G and source S, as shown in FIG. 4.

Resistor 60 is formed from a layer of oxide 102. This oxide may be, for example the oxide layer that is referred to as the "poly-layer dielectric" in many NMOS fabrication processes and that is used to isolate poly interconnects from the substrate. A layer of shallow trench isolation (STI) 104 may be formed under oxide 102 in the region of resistor 60 to help isolate resistor 60 from substrate 88. The electrically active portion of resistor 60 may be formed from a lightly-doped (or undoped) polysilicon layer 100. Metal region 105 may contact p+ tap region 109, to ohmically connect one end of resistor 60 to the substrate 88 (shown as $V_{SUB}$ in FIG. 4). The other end of resistor 60 may be connected to metal region 111. This terminal of the resistor is connected to $V_{SS}$, as shown in FIG. 5. Silicide films may be deposited directly under the contacts to the resistor 60 to provide good ohmic conduction.

The metal regions 90, 92, 105, and 111 may be electrically isolated from the other layers of antifuse structure 86 by a patterned insulating layer 112. Layer 112 may be, for example, the insulating layer often referred to as "metal 1 dielectric" where metal 1 is the bottom layer of metal interconnect. Layer 112 may be formed from any suitable insulating material such as phosphosilicate glass (PSG), chemical vapor deposition (CVD) oxide, or other insulating dielectric films.

The details of the construction of transistors 58 and 60 that are shown in FIG. 5 are merely illustrative. Any suitable materials system and layer structure may be used for transistor 58 and resistor 60 if desired. For example, transistor 58 may be a PMOS transistor and resistor 60 may be formed on diffusions in the silicon.

The p-type silicon substrate 88 lies between the source and drain and is normally not conducting due to the two back-to-back diodes formed by the n+/p/n+ structure of the transistor 58. The gate is at ground, which turns the transistor off. Because the transistor is not conducting, the resistance of transistor 58 in its unprogrammed state is high. The resistance of transistor 58 may, for example, be more than 100 MΩ.

When it is desired to program antifuse transistor 58, a programming voltage may be applied to the transistor's drain terminal. For example, logic-level control signals $V_{LLCS}$ (e.g., a 20–50 ms positive voltage pulse) may be applied to control circuitry 76 via terminal 80 (FIG. 4). The control circuit 76 may generate a corresponding control signal $V_{CS}$, which turns on pass transistor 78 and allows a programming signal pulse $V_P$ of magnitude $V_{PP}$ or $V_{pp}$ minus the threshold voltage of the transistor T2 to reach drain terminal D of transistor 58.

Taking the drain voltage to $V_{PP}$ produces a reverse bias in the drain-substrate junction of transistor 56, because the substrate voltage $V_{SUB}$ is initially grounded at $V_{SS}$ through resistor $R_2$. The depletion region boundary for the drain-substrate junction is shown by dotted line 114 in FIG. 5.

Figure 6:
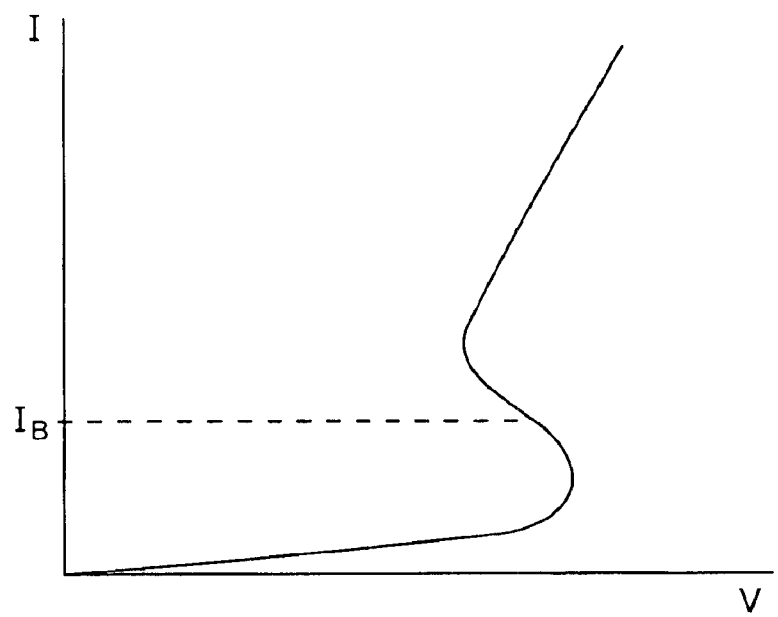
FIG. 6 is a graph showing the effects of avalanche breakdown in an antifuse structure in accordance with the present invention.

The magnitude of $V_{PP}$ may be significantly higher than the voltage $V_{CC}$ normally used to operate the transistors on circuit 56. As a result, the reverse-biased diode formed at the drain-substrate junction starts to experience avalanche breakdown. The current versus voltage characteristic of the drain-substrate junction is shown in FIG. 6. As the junction starts to break down at current $I_B$, there is a sharp bend in the I-V plot. This illustrates how the reverse-biased drain-substrate junction no longer is able to block the flow of current at currents above $I_B$ (as would be the case for a reverse-biased diode that has not entered avalanche breakdown).

During avalanche breakdown, electron-hole pairs are created at the drain-substrate junction (drain junction) and current flows from the transistor's drain to the transistor's substrate. The substrate is electrically connected to ground through p+ tap region 109 and resistor 60, so the avalanche current produces a voltage drop across resistor 60 equal to the avalanche current times the resistance $R_2$.

The depletion region's electric field E accelerates electrons 116 towards region 94 and holes 118 towards the substrate 88 and source 96. As these carriers travel through the transistor, additional carriers are freed by the avalanche breakdown effect. In addition, the voltage drop across $R_2$ causes the substrate voltage $V_{SUB}$ to rise. As the substrate voltage $V_{SUB}$ reaches about 0.7 to 1 V, the substrate-source p-n junction becomes forward biased. This in turn injects large numbers of carriers into the substrate, as shown in FIG. 5.

The injected carriers diffuse to the avalanche-breakdown region at the drain-substrate junction and are accelerated by the electric field at the junction. The additional injected carriers contribute to the avalanche breakdown of the junction and serve as a source of positive feedback. In effect, the source, substrate, and drain of the transistor act as the emitter, base, and collector of a parasitic bipolar transistor, so carriers injected into the substrate (base) from the source-substrate junction serve to turn the transistor on. As the process progresses, the drain-source current increases so much that an irreversible conductive path 120 is melted through the silicon between drain and source. This permanently programs the antifuse to be in a conductive "on" state.

The time required to program antifuse transistor 58 is typically 10s of milliseconds. With one suitable approach, each antifuse is programmed using a programming pulse of a fixed known duration (e.g., a pulse with a fixed duration in the range of 20–50 ms). Another suitable approach involves monitoring the status of transistor 58 during programming, so that the programming voltage may be reduced as soon as programming of the transistor 58 is complete. This approach can reduce the power dissipated during the programming process.

Figure 7A:
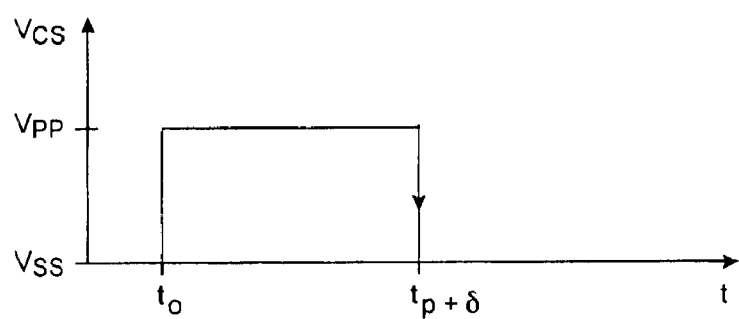
FIGS. 7a and 7b are signal traces of illustrative control and output signals associated with an electrically-programmable antifuse in accordance with the present invention.
Figure 7B:
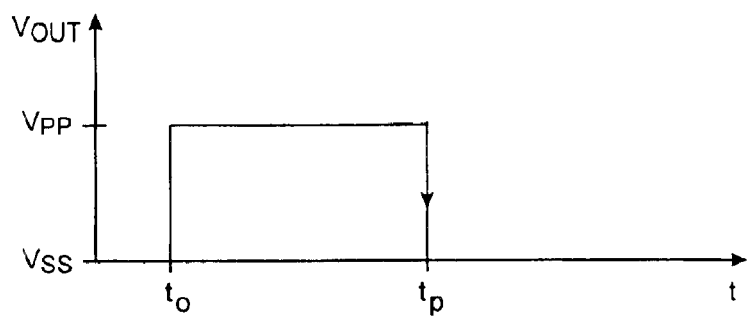

One way in which to monitor the status of transistor 58 is to use a feedback path such as path 122 of FIG. 4 to monitor the output voltage of the sensing circuit. As shown in FIG. 7a, a programming control signal pulse $V_{CS}$ may be applied to transistor 58 starting at time $t_0$. The control circuit 76 may monitor the output voltage $V_{OUT}$ using feedback path 122. As soon as the transistor 58 is programmed at time $t_p$, the resistance of the antifuse structure drops and the voltage $V_{OUT}$ drops as shown in FIG. 7b. The control circuit 76 may detect this drop and (after a small circuit delay time of δ) may immediately reduce the programming voltage signal from $V_{PP}$ to $V_{SS}$. Because the programming voltage is taken low as soon as successful programming of transistor 58 is detected, this approach reduces power dissipation through the sensing circuit after the antifuse's state has been set.

Figure 8:
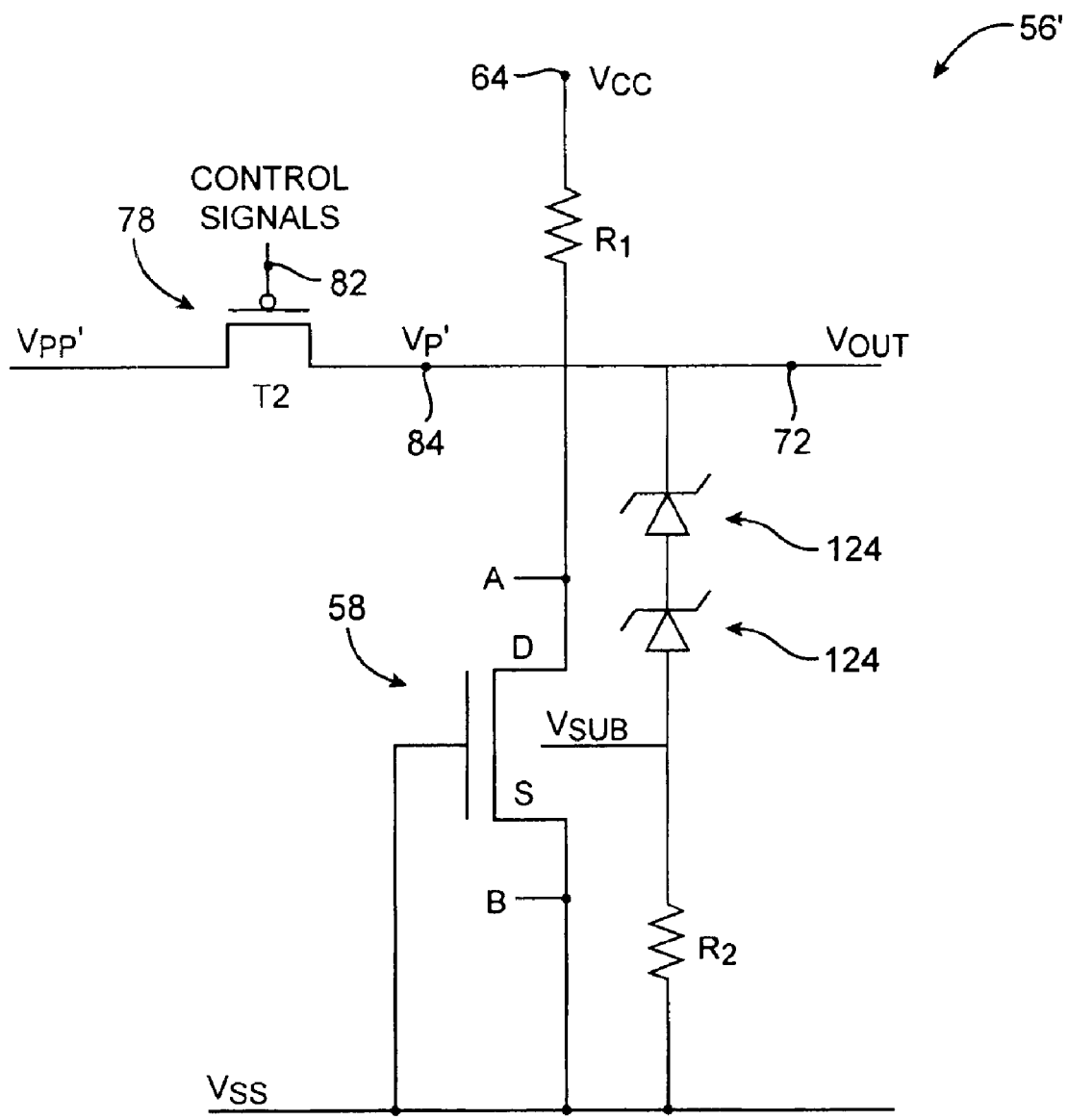
FIG. 8 is a circuit diagram of an illustrative Zener-diode-based electrically-programmable antifuse in accordance with the present invention.
Figure 9:
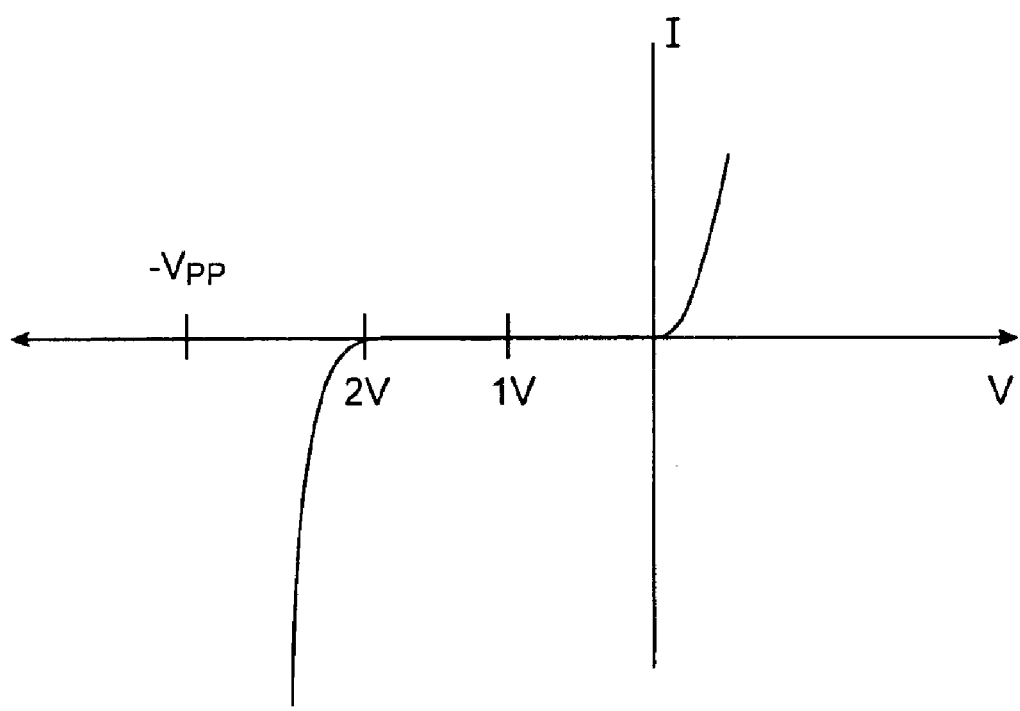
FIG. 9 is a graph of the current versus voltage behavior of the Zener diodes in the illustrative Zener-diode-based antifuse of FIG. 8 in accordance with the present invention.

If desired, the antifuse circuit may be based on reverse-biased Zener diodes. An illustrative antifuse circuit 56' that is based on two Zener diodes 124 is shown in FIG. 8. Zener diodes 124 experience Zener breakdown at about one volt of reverse bias, so that when the two Zener diodes 124 are placed in series as shown in FIG. 8, they break down at about 2 volts of reverse bias voltage, as shown in FIG. 9. Because a two-volt breakdown voltage is relatively low, a low programming voltage may be used to program the antifuse transistor 58.

Although other numbers of Zener diodes could be used (e.g., one or three or more), two Zener diodes are generally preferred. Using only one Zener diode might produce more leakage current than desired during sensing (for unprogrammed devices), which would increase power dissipation. If three Zener diodes were to be used, the required programming voltage might be higher than desired.

With the two-Zener-diode arrangement of FIG. 8, there is enough current produced through the transistor 58 to make the substrate voltage $V_{SUB}$ about 0.7–1 volt to forward bias the substrate-source junction and cause a high current to flow through the transistor 58.

In general, a lower programming voltage supply level $V_{PP}'$ may be used when compared to the avalanche-breakdown arrangement of FIGS. 4 and 5. Many modern integrated circuits use a low voltage level (e.g., 1.2 volts to operate their "core" circuitry). Circuitry near the periphery of the integrated circuit (e.g., I/O circuitry) is used to interface with off-chip circuitry and transmission lines. This peripheral circuitry therefore is generally powered using a higher supply voltage (e.g., 3.3 volts). If desired, this higher (e.g., 3.3 volt) I/O power supply voltage may be made available to the pass transistor 78, so that (in response to the control signals applied to its gate 82), the output of transistor 78 will provide a programming signal $V_p'$ that ranges from $V_{SS}$ to a voltage $V_{PP}'$ of about 3.3 volts.

With this approach it is not necessary to provide additional charge pump circuitry 74 on circuit 42 to raise the programming voltage (although a charge pump may be used if desired to provide a higher programming voltage). Moreover, special external voltage sources and special high-voltage routing circuitry on circuit 42 need not be provided. Rather, the I/O power supply voltage that is already available (for use in operating the I/O circuitry during normal operation) can be reused for antifuse programming.

As shown in FIG. 8, transistor T2 may be a PMOS transistor. With this arrangement, Vp' =Vpp' when the control signals at gate 82 are at ground. During sensing, the control signal on gate 82 may be taken to 3.3 volts (e.g., the I/O power supply voltage) to turn off transistor T2. An NMOS transistor may be used for transistor T2 if desired, although this will lead to a Vp' that is less than Vpp' unless the control signal on gate 82 is made larger than Vpp'. Vpp' (from the I/O power supply or from a charge pump) will be lower if a p-type pass gate transistor T2 is used.

In the antifuse circuit arrangement of FIG. 8, programming occurs when the carriers injected from the Zener diodes flow through the resistor $R_2$ when the diodes are experiencing Zener breakdown, which turns the transistor on. During this process, the parasitic bipolar transistor formed from the drain, source, and substrate of the transistor 58 controls the transistor's behavior. As shown in FIG. 10, the n+ silicon in the drain D of the transistor 58 serves as a bipolar transistor "collector." The n+ silicon in the source of the transistor 58 serves as a bipolar transistor "emitter." The substrate 88 serves as a bipolar "base."

When the programming voltage Vp' is applied to the drain terminal (e.g., a voltage signal having a magnitude $V_{pp}$ of about 3.3 V), the reverse bias voltage across Zener diodes 124 (−3.3 volts) exceeds their combined Zener breakdown voltage (about 2 V). As a result, the diodes enter Zener breakdown and conduct a substantial amount of current (see FIG. 9).

The current through the Zener diodes passes through the resistor $R_2$, which leads to a corresponding voltage rise in the substrate 898 (which is electrically connected to the upper terminal of resistor 60 through tap 109). As the substrate voltage $V_{SUB}$ rises to about 0.7–1 volt, the source (the "base" of the parasitic bipolar transistor), remains grounded at $V_{SS}$. This causes the substrate-source junction (the "base-emitter" junction of the parasitic bipolar transistor) to become forward biased.

The forward-biased substrate-source junction injects a large number of carriers (electrons) into the substrate. The substrate acts as the base in the parasitic bipolar, so when carriers are injected into the substrate, the drain-source current (the "collector-emitter" current in the parasitic bipolar) increases substantially as with any bipolar transistor. The resulting current is substantial enough to melt the silicon and thereby program the antifuse transistor.

Figure 11:
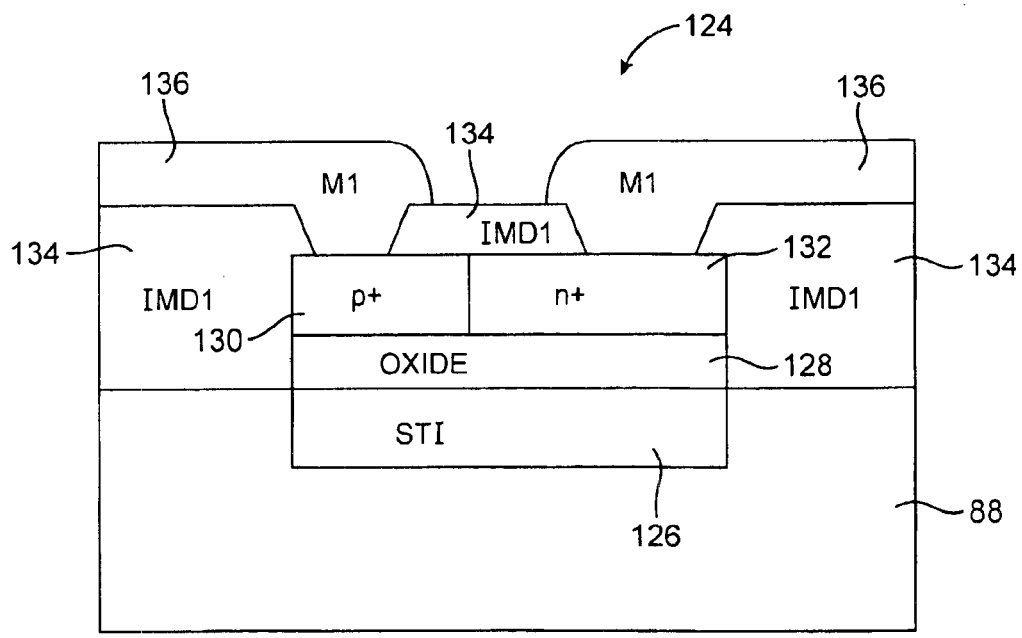
FIG. 11 is a cross-sectional side view of an illustrative Zener diode structure that may be used in a Zener-diode-based electrically-programmable antifuse in accordance with the present invention.

An illustrative Zener diode structure that may be used for diodes 124 is shown in FIG. 11. The diode 124 may be formed on silicon substrate 88 over an area of shallow trench isolation 126. The shallow trench isolation 126 helps to electrically isolate the diode 124 from the underlying silicon. An oxide layer 128 such as a layer of "poly-dielectric" may be formed on top of the shallow trench isolation region.

The p-n junction of the Zener diode may be formed using p+ region 130 and n+ region 132. A layer of dielectric (e.g., the metal 1 dielectric layer of PSG) 134 may be used to define contact holes for metal layer 136 (e.g., the first metal layer M1) in the dielectric interconnect stack on the integrated circuit 42). The structure of FIG. 11 is merely illustrative. Any suitable Zener diode device structure may be used if desired.

Figure 12:
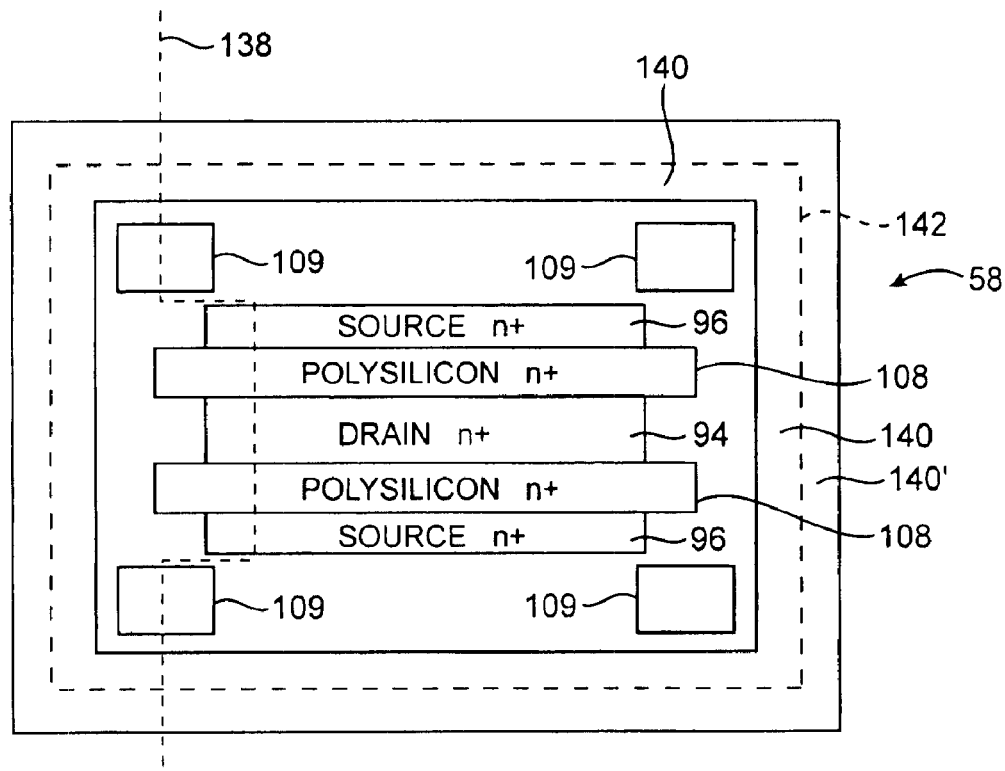
FIG. 12 is a top view of an illustrative antifuse transistor structure in accordance with the present invention.
Figure 13:
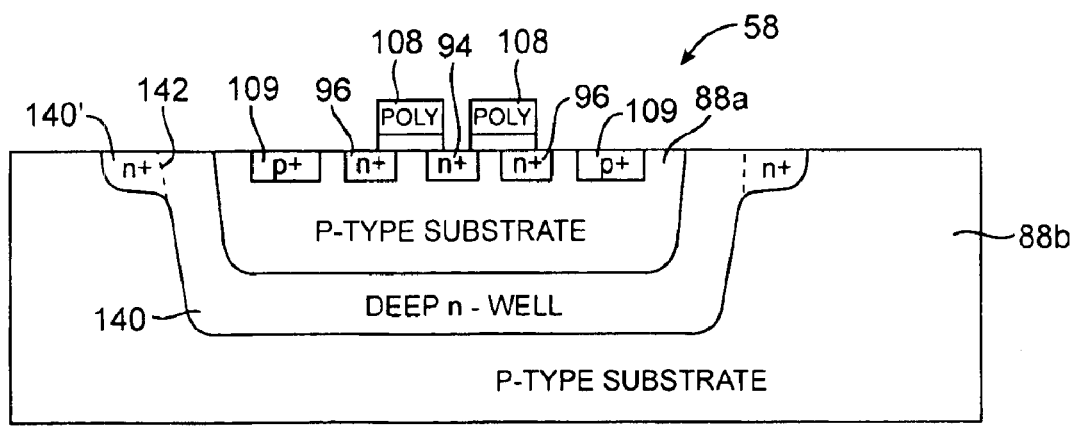
FIG. 13 is a cross-sectional side view of an illustrative antifuse transistor structure in accordance with the present invention.

An illustrative structure that may be used for the antifuse transistor 58 is shown in FIGS. 12 and 13. The layout shown in FIG. 12 is a top view of the transistor 58. The view of FIG. 13 is a cross-sectional side view of the FIG. 12 structure taken along the dotted line 138 of FIG. 12.

As shown in FIGS. 12 and 13, transistor 58 may have a single central n+ drain region 94. Two n+ regions 96 on either side of the drain region may be used to form the source. Two n+ polysilicon regions 108 may be used to form the gate of the transistor. The source and gate regions may be interconnected with each other and with $V_{SS}$ using a layer of patterned metal (not shown in FIGS. 12 and 13). P+ tap regions 109 may be used to provide an ohmic contact to the p+ substrate. The widths of the source, drain, and gate regions may be about 1–5 microns or other suitable widths. The lengths of the source, drain, and gate poly regions may be about 0.15 microns or any other suitable lengths. The effective gate size may be about 90 nm or any other suitable size.

To program the antifuse, it is necessary to raise the voltage of the substrate $V_{SUB}$ to about 0.7–1.0 volts (whether using an avalanche-breakdown antifuse or a Zener-breakdown antifuse). When the entire substrate of the integrated circuit is electrically interconnected, capacitive loading effects tend to resist efforts to raise the substrate voltage $V_{SUB}$. Accordingly, a deep n-well isolation region 140 may be used to electrically isolate p-type substrate region 88a from the rest of p-type substrate 88b. As shown by dotted line 142 and n-well doping region 140', the n-type doping of the deep n-well isolation region may be extended further along the surface of the structure to widen the area of isolation.

When an n-well arrangement of the type shown in FIGS. 12 and 13 is used to define a p-type substrate well portion 88a, the amount of p-type substrate that needs to be brought up to the voltage 0.7–1.0 volts during programming is significantly reduced. This lowers capacitive loading and makes programming of the antifuse more rapid for both avalanche-breakdown and Zener-breakdown arrangements. In addition, the deep n-well can be electrically connected to the drain n+ region through the n-well diffusion. When the drain voltage ramps up during programming, it is capacitively coupled to the isolated p-substrate region through the capacitance of the junction between the deep n-well and the isolated p-substrate. This coupling helps raise the potential of the isolated p-substrate, which can reduce the programming voltage.

The behavior of avalanche-breakdown antifuse transistors has been characterized using antifuse transistors of different sizes without deep n-well isolation region 140.

Transistors with lengths of 10 microns and widths of 0.15 microns have be observed to have off (unprogrammed) resistances of about 110 M$\Omega$ at 25° C., unprogrammed resistances of about 23 M$\Omega$ at 85° C., and programmed resistances of less than 1000 $\Omega$. The programming current for a. 4.5 V programming pulse was about 33 $\mu$A.

Transistors with lengths of 2 microns and widths of 0.15 microns have been observed to have unprogrammed resistances of 550 M$\Omega$ at 25° C. and 110 $\Omega$ at 85C. Resistances of less than 1000 $\Omega$ have been observed for these transistors following programming. The programming current for a 4.5 V programming pulse was about 13 $\mu$A.

As seen, the unprogrammed (off) resistances of these illustrative antifuse transistors is more than four orders of magnitude greater than the programmed resistances of the transistors. This provides good resolution between the high and low states at the output $V_{OUT}$. The wide range between the programmed and unprogrammed resistance values also provides a large design window for the series resistor R1. As power supply voltages scale with future improvements with process technology, the change in the unprogrammed resistance should not be large. In addition, the width of the antifuse transistor may be scaled down to maintain large enough unprogrammed resistances. Further improvements in antifuse performance (e.g., reduced programming voltage) may be obtained by using the deep n-well isolation region 140.

The programming power of the illustrative antifuses has been observed to be lower than 150 $\mu$W. Further reductions in the antifuse transistor width will result in lower programming powers.

The programming time may be 10 ms–50 ms or less. This short programming time allows many antifuses to be programmed in a relatively short time. Moreover, multiple antifuses may be programmed in parallel to further reduce the total programming time for the programming operation.

Figure 14:
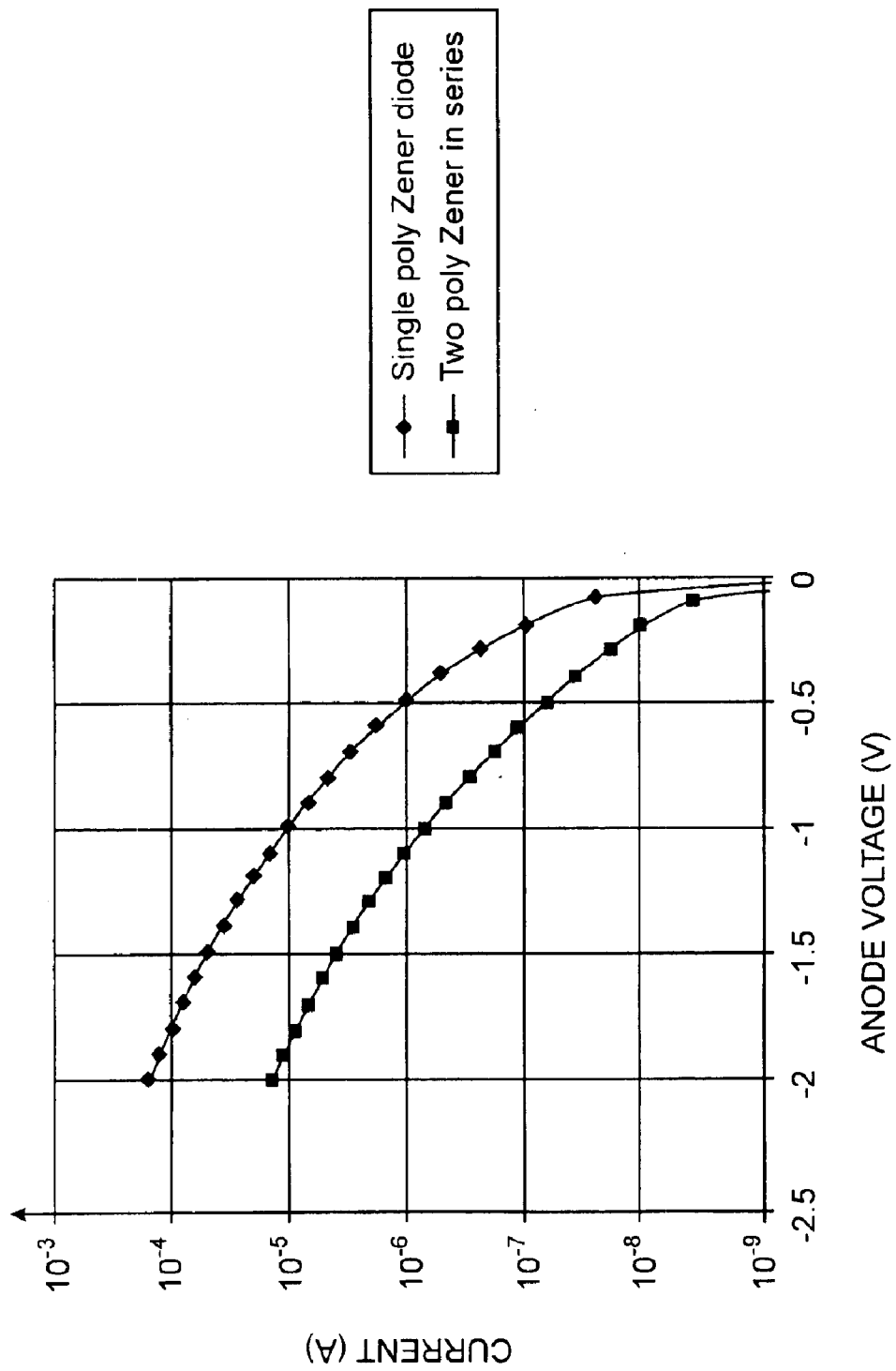
FIG. 14 is a graph illustrating the current versus voltage behavior of electrically-programmable antifuses based on single and double Zener diode configurations in accordance with the present invention.

The current-voltage behavior of a two-diode Zener-diode stack has been observed, as shown in the current versus voltage plots of FIG. 14. The behavior of both a single Zener diode and two Zener diodes in series are plotted. Programming currents of 13 $\mu$A may be used for antifuse transistors of 2 microns in length and 0.15 microns in width with a voltage of 2.3 volts across the two-diode Zener-diode stack. As a result, a programming voltage of 3.3 volts (the I/O supply voltage) is sufficient to sustain the substrate potential of 0.7–1.0 volts that is needed to turn on the parasitic bipolar transistor in the antifuse. The total unprogrammed resistance (Zener-diode stack and R$_2$) is below 1 M$\Omega$ at a 1.2 volt sensing voltage. Because the programmed resistance of the antifuse transistor is below 1000 $\Omega$, there is still a good window between the high and low output voltage states.

Antifuse 58 can be programmed electrically at low powers. Programming powers may be 10 to 100 times lower than other types of antifuses. The lower powers reduce the risk of thermo-mechanical damage to process layers on the circuit. The low powers and electrical programming capabilities of the antifuse also reduce equipment overhead requirements and reduce programming times.

The foregoing is merely illustrative of the principles of this invention and various modifications can be made by those skilled in the art without departing from the scope and spirit of the invention.

What is claimed is:

1. Electrically-programmable integrated circuit antifuse circuitry formed from a semiconductor, comprising:
   a metal-oxide-semiconductor antifuse transistor having a drain, source, gate, and substrate, wherein the drain and substrate form a drain-substrate p-n junction in the semiconductor; and
   circuitry connected to the antifuse transistor that applies a voltage to the drain that causes avalanche breakdown of the drain-substrate p-n junction and a rise in voltage at the substrate that turns the antifuse transistor on and produces sufficient current between the drain and source to melt the semiconductor and program the antifuse.

2. The electrically-programmable integrated circuit antifuse circuitry defined in claim 1 wherein the gate has only a single polysilicon layer.

3. The electrically-programmable integrated circuit antifuse circuitry defined in claim 1 further comprising sensing circuitry that senses whether the antifuse transistor has been programmed and outputs a high or low logic signal accordingly.

4. The electrically-programmable integrated circuit antifuse circuitry defined in claim 1, wherein the antifuse transistor is used on an integrated circuit having a core power supply voltage $V_{CC}$, the electrically-programmable integrated circuit antifuse transistor further comprising a charge pump that produces a programming supply voltage having a magnitude greater than $V_{CC}$.

5. The electrically-programmable integrated circuit antifuse circuitry defined in claim 1 further comprising a resistor connected between the substrate and a ground.

6. The electrically-programmable integrated circuit antifuse circuitry defined in claim 1 further comprising a region of metal that electrically interconnects the gate and the source.

7. The electrically-programmable integrated circuit antifuse circuitry defined in claim 1 further comprising a resistor connected between the drain and a positive power supply voltage.

8. The electrically-programmable integrated circuit antifuse circuitry defined in claim 1 wherein the gate is electrically connected to the source, the integrated circuit antifuse circuitry further comprising:
   a resistor connected between the drain and a positive power supply voltage; and
   a second resistor connected between the substrate and a ground potential.

9. The electrically-programmable integrated circuit antifuse circuitry defined in claim 1 wherein the drain, source, and substrate are surrounded by an n-well isolation region.

10. Electrically-programmable integrated circuit antifuse circuitry formed from a semiconductor, comprising:
    a metal-oxide-semiconductor antifuse transistor having a drain, source, gate, and substrate;
    at least one Zener diode connected between the drain and substrate; and
    circuitry connected to the antifuse transistor and Zener diode that applies a voltage to the drain which causes Zener breakdown of the Zener diode and a rise in voltage at the substrate that turns the antifuse transistor on and produces sufficient current between the drain and source to melt the semiconductor and program the antifuse.

11. The electrically-programmable integrated circuit antifuse circuitry defined in claim 10 wherein there are only two Zener diodes connected between the drain and substrate, wherein the two Zener diodes are connected in series.

12. The electrically-programmable integrated circuit antifuse circuitry defined in claim 10 wherein the circuitry is formed on an integrated circuit having I/O circuitry powered by an I/O power supply voltage, wherein the voltage applied to the drain that causes the Zener breakdown is the same as the I/O power supply voltage.

13. The electrically-programmable integrated circuit antifuse circuitry defined in claim 10 further comprising sensing circuitry that senses whether the antifuse transistor has been programmed and outputs a high or low logic signal accordingly.

14. The electrically-programmable integrated circuit antifuse circuitry defined in claim 10 further comprising a resistor connected between the substrate and a ground potential, wherein current through the Zener diode during Zener breakdown passes through the resistor and biases the substrate.

15. The electrically-programmable integrated circuit antifuse circuitry defined in claim 10 further comprising a region of metal that electrically interconnects the gate and the source.

16. The electrically-programmable integrated circuit antifuse circuitry defined in claim 10 further comprising a resistor connected between the drain and a positive power supply voltage.

17. The electrically-programmable integrated circuit antifuse circuitry defined in claim 10 wherein the gate is electrically connected to the source, the integrated circuit antifuse circuitry further comprising:
    a resistor connected between the drain and a positive voltage; and
    a second resistor connected between the substrate and a ground potential.

18. The electrically-programmable integrated circuit antifuse circuitry defined in claim 10 wherein the drain, source, and substrate are surrounded by an n-well isolation region.

* * * * *